(12) United States Patent  
Ko (10) Patent No.: US 9,224,443 B2  
(45) Date of Patent: Dec. 29, 2015

(54) SEMICONDUCTOR DEVICES AND ELECTRONIC SYSTEMS INCLUDING THE SAME

(71) Applicant: SK hynix Inc., Icheon-si Gyeonggi-do (KR)

(72) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 218 days.

(21) Appl. No.: 14/054,909

(22) Filed: Oct. 16, 2013

(65) Prior Publication Data

US 2014/0348281 A1    Nov. 27, 2014

(30) Foreign Application Priority Data

May 27, 2013  (KR) .................. 10-2013-0060005

(51) Int. Cl.
*G11C 8/18*   (2006.01)
*G11C 7/22*   (2006.01)
*G11C 7/10*   (2006.01)

(52) U.S. Cl.
CPC *G11C 7/222* (2013.01); *G11C 8/18* (2013.01); *G11C 7/1093* (2013.01); *G11C 7/22* (2013.01)

(58) Field of Classification Search
CPC ........ G11C 7/22; G11C 7/222; G11C 7/1093; G11C 8/18

USPC .......... 365/233.12, 233.13, 194, 193
See application file for complete search history.

(56) References Cited

U.S. PATENT DOCUMENTS

| 2003/0031082 | A1 | 2/2003 | Sawada | |
| 2007/0291577 | A1* | 12/2007 | Koshizuka | 365/233 |
| 2009/0091992 | A1* | 4/2009 | Lee | 365/193 |
| 2011/0047319 | A1* | 2/2011 | Jeon et al. | 711/103 |
| 2012/0106276 | A1* | 5/2012 | Kim et al. | 365/193 |
| 2012/0137084 | A1* | 5/2012 | Ok | 711/154 |

FOREIGN PATENT DOCUMENTS

KR    101083674 B1    11/2011

* cited by examiner

*Primary Examiner* — Toan Le
(74) *Attorney, Agent, or Firm* — William Park & Associates Ltd.

(57) ABSTRACT

Semiconductor devices are provided. The semiconductor device includes an internal clock generator and an internal strobe signal generator. The internal clock generator generates an internal clock signal having a frequency which is higher than that of an input clock signal according to a phase difference between the input clock signal generated from an external device and a first input control signal. The internal strobe signal generator generates an internal strobe signal having a frequency which is higher than that of an input strobe signal according to a phase difference between the input strobe signal generated from the external device and a second input control signal.

19 Claims, 6 Drawing Sheets

SEMICONDUCTOR DEVICES AND ELECTRONIC SYSTEMS INCLUDING THE SAME

CROSS-REFERENCE TO RELATED APPLICATION

The present application claims priority under 35 U.S.C. 119(a) to Korean Application No. 10-2013-0060005, filed on May 27, 2013, in the Korean Intellectual Property Office, which is incorporated herein by reference in its entirety as set forth in full.

BACKGROUND

1. Technical Field

Embodiments of the present disclosure generally relate to semiconductor integrated circuits and, more particularly, to semiconductor devices and electronic systems including the same.

2. Related Art

Synchronous memory devices operating in synchronization with clock signals have been revealed to improve the operation speed of semiconductor memory devices. Single data rate (SDR) synchronous memory devices among the synchronous memory devices receive or output a single data per a single data pin for one cycle time of the clock signal in synchronization with every rising edge of the clock signal. However, high performance memory devices operating at a higher speed than the SDR synchronous memory devices have been demanded to meet the requirements of high performance electronic systems. Accordingly, double data rate (DDR) synchronous memory devices have been proposed recently.

The DDR synchronous memory devices may receive or output the data twice during a single cycle time of the clock signal. That is, the DDR synchronous memory devices may receive or output the data in synchronization with every rising edge and every falling edge of the clock signal. Thus, the DDR synchronous memory devices may operate at a speed which is twice more than that of the SDR synchronous memory devices even without the increase of the frequency of the clock signal.

Additionally, the semiconductor memory devices may be designed and fabricated to include a test mode function for evaluating the operation thereof. That is, the semiconductor memory devices may be evaluated in a test mode and the test results may be monitored whether the semiconductor memory devices normally operate or not.

The evaluation of the semiconductor memory devices may be performed using a test apparatus. If the semiconductor memory devices operating at a high speed are tested with a low frequency test apparatus, a test time may unnecessarily increase.

SUMMARY

Various embodiments are directed to semiconductor devices and electronic systems including the same.

According to some embodiments, an electronic system includes a first semiconductor device and a second semiconductor device. The first semiconductor device outputs a clock signal, a strobe signal, a first control signal having a predetermined phase difference from the clock signal, and a second control signal having the predetermined phase difference from the strobe signal. The second semiconductor device generates an internal clock signal and an internal strobe signal. The internal clock signal is generated to have a higher frequency than the clock signal according to a phase difference between the clock signal and the first control signal, and the internal strobe signal is generated to have a higher frequency than the strobe signal according to a phase difference between the strobe signal and the second control signal to receive and/or output data.

According to further embodiments, a semiconductor device includes an internal clock generator and an internal strobe signal generator. The internal clock generator generates an internal clock signal having a frequency which is higher than that of an input clock signal according to a phase difference between the input clock signal generated from an external device and a first input control signal. The internal strobe signal generator generates an internal strobe signal having a frequency which is higher than that of an input strobe signal according to a phase difference between the input strobe signal generated from the external device and a second input control signal.

BRIEF DESCRIPTION OF THE DRAWINGS

Embodiments of the present invention will become more apparent in view of the attached drawings and accompanying detailed description, in which.

DETAILED DESCRIPTION

Embodiments of the present invention will be described hereinafter with reference to the accompanying drawings. However, the embodiments described herein are for illustrative purposes only and are not intended to limit the scope of the invention. As used herein, the term "and/or" includes any and all combinations of one or more of the associated listed items.

Figure 1:
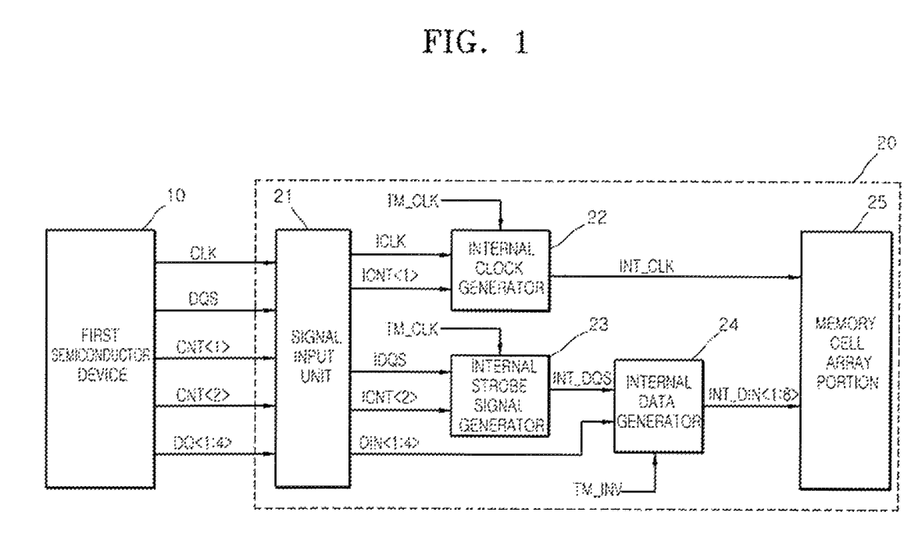
FIG. 1 is a block diagram illustrating an electronic system according to some embodiments.

Referring to FIG. 1, an electronic system according to an embodiment may be configured to include a first semiconductor device 10 and a second semiconductor device 20. The first semiconductor device 10 may generate and output a clock signal CLK, a strobe signal DQS, a first control signal CNT<1> having a predetermined phase difference from the clock signal CLK, a second control signal CNT<2> having the predetermined phase difference from the strobe signal DQS, and first to fourth data DQ<1:4>. The second semiconductor device 20 may generate an internal clock signal INT_CLK having a higher frequency than the clock signal CLK according to a phase difference between the clock signal CLK and the first control signal CNT<1> and an internal strobe signal INT_DQS having a higher frequency than the strobe signal DQS according to a phase difference between the strobe signal DQS and the second control signal CNT<2>, thereby receiving and/or outputting data. The first semiconductor device 10 may have a different configuration according to some embodiments. For example, the first semiconductor device 10 may be a memory controller that controls an operation of the second semiconductor device 20 such as a semiconductor memory device or a test apparatus that measures various characteristics of the second semiconductor device 20. Further, the strobe signal DQS may be synchronized with the clock signal CLK and may be used to receive and/or output the data in synchronization with the clock signal CLK in a synchronous memory device.

The second semiconductor device 20 may be configured to include a signal input unit 21, an internal clock generator 22, an internal strobe signal generator 23, an internal data generator 24 and a memory cell array portion 25.

The signal input unit 21 may buffer the clock signal CLK, the strobe signal DQS, the first and second control signals CNT<1:2> and the first to fourth data DQ<1:4> outputted from the first semiconductor device 10 to generate an input clock signal ICLK, a first input control signal ICNT<1>, a second input control signal ICNT<2>, an input strobe signal IDQS and first to fourth input data DIN<1:4>. The signal input unit 21 may appropriately retard and process the input signals such as the clock signal CLK, the strobe signal DQS, the first and second control signals CNT<1:2> and the first to fourth data DQ<1:4> according to characteristics of signal transmission paths between the first and second semiconductor devices 10 and 20.

The internal clock generator 22 may generate the internal clock signal INT_CLK having a frequency which is twice higher than that of the input clock signal ICLK according to a phase difference between the input clock signal ICLK and the first input control signal ICNT<1> when a first test mode signal TM_CLK is enabled. In some embodiments, the phase difference between the input clock signal ICLK and the first input control signal ICNT<1> may be set to be 270 degrees or 90 degrees.

The internal strobe signal generator 23 may generate the internal strobe signal INT_DQS having a frequency which is twice higher than that of the input strobe signal IDQS according to a phase difference between the input strobe signal IDQS and the second input control signal ICNT<2> when the first test mode signal TM_CLK is enabled. In some embodiments, the phase difference between the input strobe signal IDQS and the second input control signal ICNT<2> may be set to be 270 degrees or 90 degrees.

The internal data generator 24 may control phases of the first to fourth input data DIN<1:4> synchronized with the input strobe signal IDQS in response to a second test mode signal TM_INV to generate first to eighth internal data INT_DIN<1:8> and may store the first to eighth internal data INT_DIN<1:8> in the memory cell array portion 25. The number of bits of the first to eighth internal data INT_DIN<1:8> may be twice the number of bits of the first to fourth input data DIN<1:4>. For example, the internal data generator 24 may receive the first to fourth input data DIN<1:4> having four bits to generate the first to eighth internal data INT_DIN<1:8> having eight bits. That is, the internal data generator 24 may be configured to generate various data patterns according to the embodiments.

An operation of the internal data generator 24 will be described more fully with reference to the accompanying drawings later.

Now, a configuration of the internal clock generator 22 will be described in more detail with reference to FIG. 2.

Figure 2:
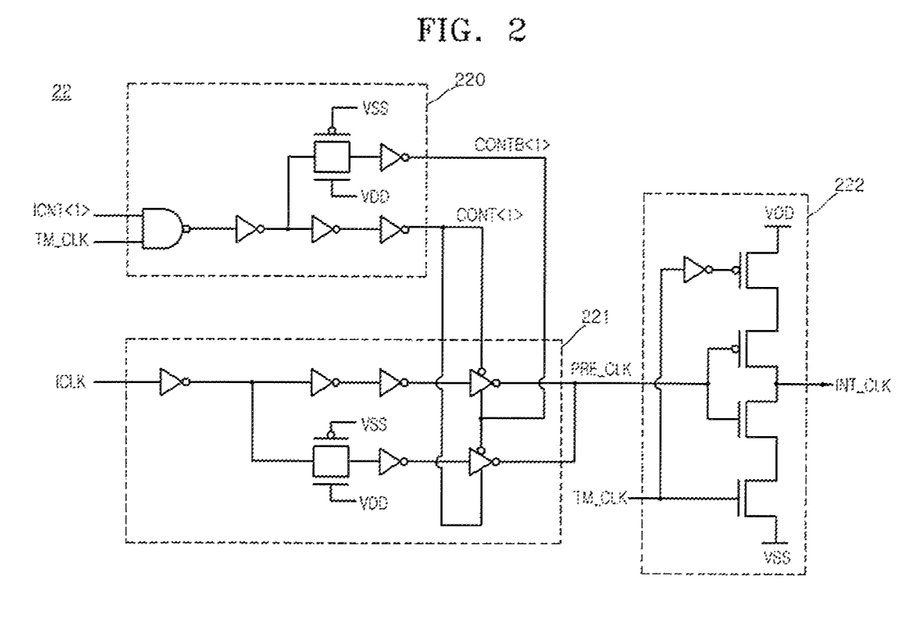
FIG. 2 is a circuit diagram illustrating an internal clock generator included in a second semiconductor device of the electronic system shown in FIG. 1.

Referring to FIG. 2, the internal clock generator 22 may include a first control signal generator 220, a pre-clock generator 221 and a first driver 222. The first control signal generator 220 may buffer the first input control signal ICNT<1> to generate a first internal control signal CONT<1> and a first complementary internal control signal CONTB<1> when the first test mode signal TM_CLK is enabled to have a logic "high" level. The pre-clock generator 221 may output an inverted signal of the input clock signal ICLK as a pre-clock signal PRE_CLK when the first internal control signal CONT<1> has a logic "high" level and the first complementary internal control signal CONTB<1> has a logic "low" level. In contrast, the pre-clock generator 221 may output a non-inverted signal of the input clock signal ICLK as the pre-clock signal PRE_CLK when the first internal control signal CONT<1> has a logic "low" level and the first complementary internal control signal CONTB<1> has a logic "high" level. The first driver 222 may output an inverted signal of the pre-clock signal PRE_CLK as the internal clock signal INT_CLK when the first test mode signal TM_CLK is enabled to have a logic "high" level. The first complementary internal control signal CONTB<1> may be an inverted signal of the first internal control signal CONT<1>. Additionally, FIG. 2 illustrates ground voltages VSS and power supply voltages VDD.

Hereinafter, an operation of the internal clock generator 22 will be described with reference to FIG. 3.

Figure 3:
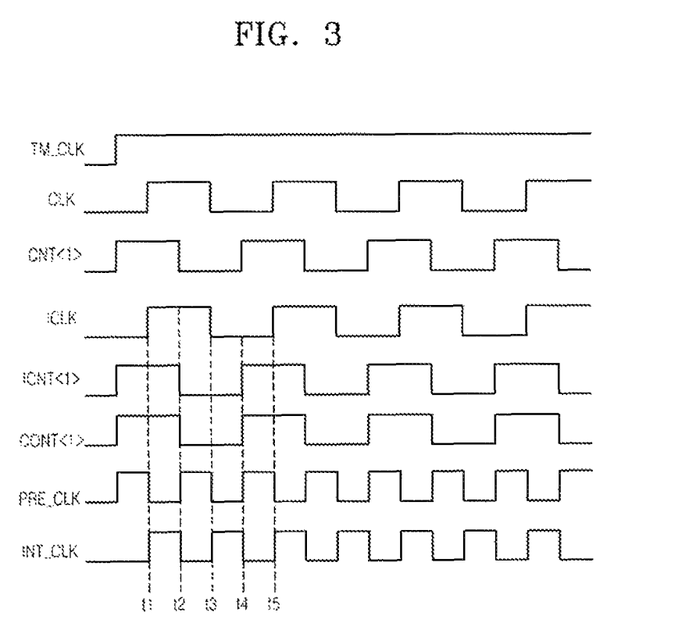
FIG. 3 is a timing diagram illustrating an operation of the internal clock generator shown in FIG. 2.

Referring to FIG. 3, at a point of time "t1", the first control signal generator 220 may buffer the first input control signal ICNT<1> in response to the first test mode signal TM_CLK enabled to have a logic "high" level to generate the first internal control signal CONT<1> having a logic "high" level. The first input control signal ICNT<1> may correspond to a signal that the first control signal CNT<1> is buffered in the signal input unit 21.

At the point of time "t1", the pre-clock generator 221 may invert the input clock signal ICLK in response to the first internal control signal CONT<1> having a logic "high" level to generate the pre-clock signal PRE_CLK having a logic "low" level. The input clock signal ICLK may correspond to a signal that the clock signal CLK is buffered in the signal input unit 21. Further, the first driver 222 may invert the pre-clock signal PRE_CLK in response to the first test mode signal TM_CLK having a logic "high" level to generate the internal clock signal INT_CLK having a logic "high" level.

Subsequently, at a point of time "t2", the first control signal generator 220 may buffer the first input control signal ICNT<1> in response to the first test mode signal TM_CLK enabled to have a logic "high" level to generate the first internal control signal CONT<1> having a logic "low" level. The pre-clock generator 221 may buffer the input clock signal ICLK in response to the first internal control signal CONT<1> having a logic "low" level to generate the pre-clock signal PRE_CLK having a logic "high" level. Further, the first driver 222 may invert the pre-clock signal PRE_CLK in response to the first test mode signal TM_CLK having a logic "high" level to generate the internal clock signal INT_CLK having a logic "low" level.

Subsequently, at a point of time "t3", the first control signal generator 220 may buffer the first input control signal ICNT<1> in response to the first test mode signal TM_CLK enabled to have a logic "high" level to generate the first internal control signal CONT<1> having a logic "low" level. The pre-clock generator 221 may buffer the input clock signal ICLK in response to the first internal control signal CONT<1> having a logic "low" level to generate the pre-clock signal PRE_CLK having a logic "low" level. Further, the first driver 222 may invert the pre-clock signal PRE_CLK in response to the first test mode signal TM_CLK having a logic "high" level to generate the internal clock signal INT_CLK having a logic "high" level.

Subsequently, at a point of time "t4", the first control signal generator 220 may buffer the first input control signal ICNT<1> in response to the first test mode signal TM_CLK enabled to have a logic "high" level to generate the first internal control signal CONT<1> having a logic "high" level. The pre-clock generator 221 may invert the input clock signal ICLK in response to the first internal control signal CONT<1> having a logic "high" level to generate the pre-clock signal PRE_CLK having a logic "high" level. Further, the first driver 222 may invert the pre-clock signal PRE_CLK in response to the first test mode signal TM_CLK having a logic "high" level to generate the internal clock signal INT_CLK having a logic "low" level.

Subsequently, at a point of time "t5", the first control signal generator 220 may buffer the first input control signal ICNT<1> in response to the first test mode signal TM_CLK enabled to have a logic "high" level to generate the first internal control signal CONT<1> having a logic "high" level. The pre-clock generator 221 may invert the input clock signal ICLK in response to the first internal control signal CONT<1> having a logic "high" level to generate the pre-clock signal PRE_CLK having a logic "low" level. Further, the first driver 222 may invert the pre-clock signal PRE_CLK in response to the first test mode signal TM_CLK having a logic "high" level to generate the internal clock signal INT_CLK having a logic "high" level.

As described above, the internal clock generator 22 may generate the internal clock signal INT_CLK having a frequency which is twice higher than that of the input clock signal ICLK according to a phase difference between the input clock signal ICLK and the first input control signal ICNT<1>.

Hereinafter, a configuration of the internal strobe signal generator 23 will be described more fully with reference to FIG. 4.

Figure 4:
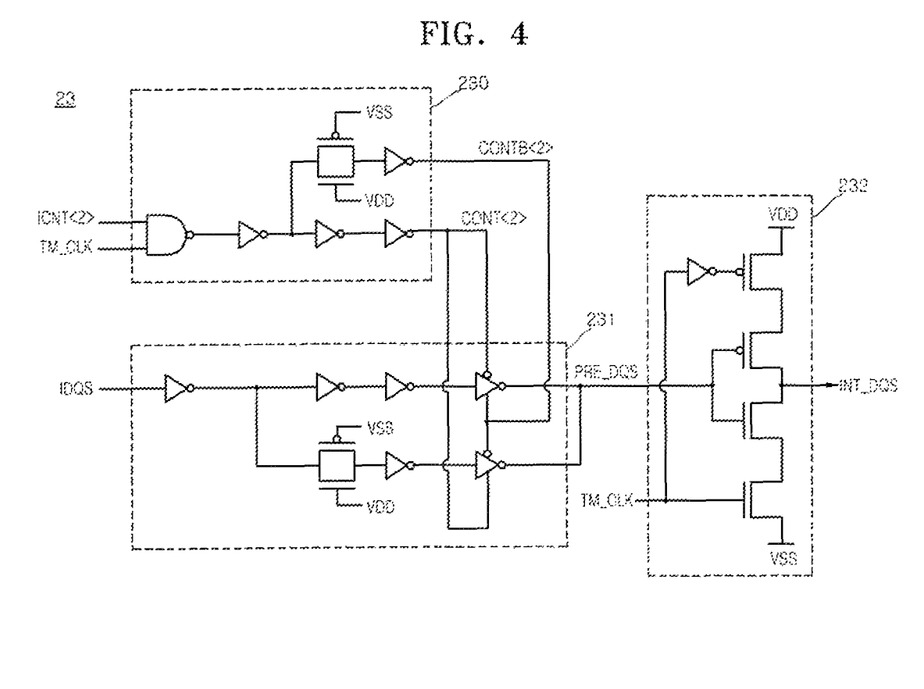
FIG. 4 is a circuit diagram illustrating an internal strobe signal generator included in a second semiconductor device of the electronic system shown in FIG. 1.

Referring to FIG. 4, the internal strobe signal generator 23 may include a second control signal generator 230, a pre-strobe signal generator 231 and a second driver 232. The second control signal generator 230 may buffer the second input control signal ICNT<2> to generate a second internal control signal CONT<2> and a second complementary internal control signal CONTB<2> when the first test mode signal TM_CLK is enabled to have a logic "high" level. The pre-strobe signal generator 231 may output an inverted signal of the input strobe signal IDQS as a pre-strobe signal PRE_DQS when the second internal control signal CONT<2> has a logic "high" level and the second complementary internal control signal CONTB<2> has a logic "low" level. In contrast, the pre-strobe signal generator 231 may output a non-inverted signal of the input strobe signal IDQS as the pre-strobe signal PRE_DQS when the second internal control signal CONT<2> has a logic "low" level and the second complementary internal control signal CONTB<2> has a logic "high" level. The second driver 232 may output an inverted signal of the pre-strobe signal PRE_DQS as the internal strobe signal INT_DQS when the first test mode signal TM_CLK is enabled to have a logic "high" level. The second complementary internal control signal CONTB<2> may be an inverted signal of the second internal control signal CONT<2>. Additionally, FIG. 4 illustrates ground voltages VSS and power supply voltages VDD.

An operation of the internal strobe signal generator 23 will be described more fully with reference to FIG. 5.

Figure 5:
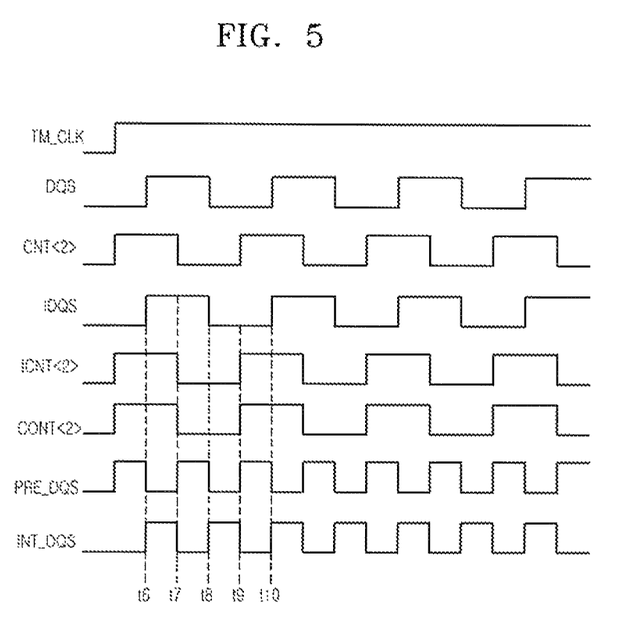
FIG. 5 is a timing diagram illustrating an operation of the internal strobe signal generator shown in FIG. 4.

Referring to FIG. 5, at a point of time "t6", the second control signal generator 230 may buffer the second input control signal ICNT<2> in response to the first test mode signal TM_CLK enabled to have a logic "high" level to generate the second internal control signal CONT<2> having a logic "high" level. The second input control signal ICNT<2> may correspond to a signal that the second control signal CNT<2> is buffered in the signal input unit 21.

At the point of time "t6", the pre-strobe signal generator 231 may invert the input strobe signal IDQS in response to the second internal control signal CONT<2> having a logic "high" level to generate the pre-strobe signal PRE_DQS having a logic "low" level. The input strobe signal IDQS may correspond to a signal that the strobe signal DQS is buffered in the signal input unit 21. Further, the second driver 232 may invert the pre-strobe signal PRE_DQS in response to the first test mode signal TM_CLK having a logic "high" level to generate the internal strobe signal INT_DQS having a logic "high" level.

Subsequently, at a point of time "t7", the second control signal generator 230 may buffer the second input control signal ICNT<2> in response to the first test mode signal TM_CLK enabled to have a logic "high" level to generate the second internal control signal CONT<2> having a logic "low" level. The pre-strobe generator 231 may buffer the input strobe signal IDQS in response to the second internal control signal CONT<2> having a logic "low" level to generate the pre-strobe signal PRE_DQS having a logic "high" level. Further, the second driver 232 may invert the pre-strobe signal PRE_DQS in response to the first test mode signal TM_CLK having a logic "high" level to generate the internal strobe signal INT_DQS having a logic "low" level.

Subsequently, at a point of time "t8", the second control signal generator 230 may buffer the second input control signal ICNT<2> in response to the first test mode signal TM_CLK enabled to have a logic "high" level to generate the second internal control signal CONT<2> having a logic "low" level. The pre-strobe signal generator 231 may buffer the input strobe signal IDQS in response to the second internal control signal CONT<2> having a logic "low" level to generate the pre-strobe signal PRE_DQS having a logic "low" level. Further, the second driver 232 may invert the pre-strobe signal PRE_DQS in response to the first test mode signal TM_CLK having a logic "high" level to generate the internal strobe signal INT_DQS having a logic "high" level.

Subsequently, at a point of time "t9", the second control signal generator 230 may buffer the second input control signal ICNT<2> in response to the first test mode signal TM_CLK enabled to have a logic "high" level to generate the second internal control signal CONT<2> having a logic "high" level. The pre-strobe signal generator 231 may invert the input strobe signal IDQS in response to the second internal control signal CONT<2> having a logic "high" level to generate the pre-strobe signal PRE_DQS having a logic "high" level. Further, the second driver 232 may invert the pre-strobe signal PRE_DQS in response to the first test mode signal TM_CLK having a logic "high" level to generate the internal strobe signal INT_DQS having a logic "low" level.

Subsequently, at a point of time "t10", the second control signal generator 230 may buffer the second input control signal ICNT<2> in response to the first test mode signal TM_CLK enabled to have a logic "high" level to generate the second internal control signal CONT<2> having a logic "high" level. The pre-strobe signal generator 231 may invert the input strobe signal IDQS in response to the second internal control signal CONT<2> having a logic "high" level to generate the pre-strobe signal PRE_DQS having a logic "low" level. Further, the second driver 232 may invert the pre-strobe signal PRE_DQS in response to the first test mode signal TM_CLK having a logic "high" level to generate the internal strobe signal INT_DQS having a logic "high" level.

As described above, the internal strobe signal generator 23 may generate the internal strobe signal INT_DQS having a frequency which is twice higher than that of the input strobe signal IDQS according to a phase difference between the input strobe signal IDQS and the second input control signal ICNT<2>.

Figure 6:
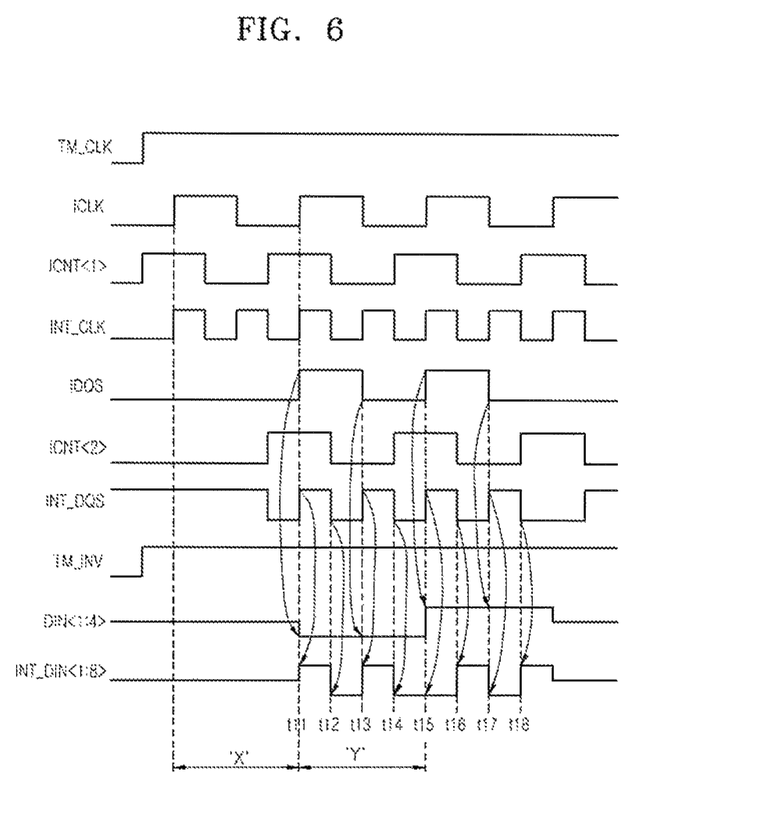
FIG. 6 is a timing diagram illustrating an operation of the electronic system according to some embodiments.

An operation of the internal data generator 24 will be described more fully with reference to FIG. 6 in conjunction with an example that the second test mode signal TM_INV is enabled to have a logic "high" level with a burst length BL of "four" and the first to fourth input data DIN<1:4> have a logic combination 'L,L,H,H'. The logic combination 'L,L,H,H' of the first to fourth input data DIN<1:4> means that the first, second, third and fourth input data DIN<1:4> have a logic "low (L)" level, a logic "low (L)" level, a logic "high (H)" level and a logic "high (H)" level, respectively. Other logic combinations used herein should be interpreted in a like fashion.

First, at a point of time "t11", the internal data generator 24 may invert the first input data DIN<1> having a logic "low" level synchronized with a rising edge of the input strobe signal IDQS to generate the first internal data INT_DIN<1> having a logic "high" level synchronized with a rising edge of the internal strobe signal INT_DQS.

Subsequently, at a point of time "t12", the internal data generator 24 may buffer the first input data DIN<1> having a logic "low" level synchronized with a rising edge of the input strobe signal IDQS to generate the second internal data INT_DIN<2> having a logic "low" level synchronized with a falling edge of the internal strobe signal INT_DQS.

Subsequently, at a point of time "t13", the internal data generator 24 may invert the second input data DIN<2> having a logic "low" level synchronized with a falling edge of the input strobe signal IDQS to generate the third internal data INT_DIN<3> having a logic "high" level synchronized with a rising edge of the internal strobe signal INT_DQS.

Subsequently, at a point of time "t14", the internal data generator 24 may buffer the second input data DIN<2> having a logic "low" level synchronized with a falling edge of the input strobe signal IDQS to generate the fourth internal data INT_DIN<4> having a logic "low" level synchronized with a falling edge of the internal strobe signal INT_DQS.

Subsequently, at a point of time "t15", the internal data generator 24 may invert the third input data DIN<3> having a logic "high" level synchronized with a rising edge of the input strobe signal IDQS to generate the fifth internal data INT_DIN<5> having a logic "low" level synchronized with a rising edge of the internal strobe signal INT_DQS.

Subsequently, at a point of time "t16", the internal data generator 24 may buffer the third input data DIN<3> having a logic "high" level synchronized with a rising edge of the input strobe signal IDQS to generate the sixth internal data INT_DIN<6> having a logic "high" level synchronized with a falling edge of the internal strobe signal INT_DQS.

Subsequently, at a point of time "t17", the internal data generator 24 may invert the fourth input data DIN<4> having a logic "high" level synchronized with a falling edge of the input strobe signal IDQS to generate the seventh internal data INT_DIN<7> having a logic "low" level synchronized with a rising edge of the internal strobe signal INT_DQS.

Subsequently, at a point of time "t18", the internal data generator 24 may buffer the fourth input data DIN<4> having a logic "high" level synchronized with a falling edge of the input strobe signal IDQS to generate the eighth internal data INT_DIN<8> having a logic "high" level synchronized with a falling edge of the internal strobe signal INT_DQS.

As a result, the internal data generator 24 may control phases of the first to fourth input data DIN<1:4> having a logic combination 'L,L,H,H' to generate the first to eighth internal data INT_DIN<1:8> having a logic combination 'H,L,H,L,L,H,L,H' and may store the first to eighth internal data INT_DIN<1:8> having a logic combination 'H,L,H,L,L,H,L,H' in the memory cell array portion 25. The logic combination 'H,L,H,L,L,H,L,H' of the first to eighth internal data INT_DIN<1:8> means that the first to eighth internal data INT_DIN<1:8> have a logic "high (H)" level, a logic "low (L)" level, a logic "high (H)" level, a logic "low (L)" level, a logic "low (L)" level, a logic "high (H)" level, a logic "low (L)" level and a logic "high (H)" level, respectively.

An operation of the electronic system according to some embodiments will be described more fully with reference to FIG. 6 in conjunction with an example that the internal clock signal INT_CLK has a frequency which is twice higher than that of the clock signal CLK and the internal strobe signal INT_DQS has a frequency which is twice higher than that of the strobe signal DQS with a burst length BL of "four".

Referring again to FIGS. 1 and 6, the first semiconductor device 10 may generate and output the clock signal CLK, the strobe signal DQS, the first control signal CNT<1> having a phase difference of 270 degrees from the clock signal CLK, the second control signal CNT<2> having a phase difference of 270 degrees from the strobe signal DQS, and first to fourth data DQ<1:4>.

The signal input unit 21 of the second semiconductor device 20 may buffer the clock signal CLK, the strobe signal DQS, the first and second control signals CNT<1:2> and the first to fourth data DQ<1:4> outputted from the first semiconductor device 10 to generate the input clock signal ICLK, the first and second input control signals ICNT<1:2>, the input strobe signal IDQS, and the first to fourth input data DIN<1:4>.

The internal clock generator 22 of the second semiconductor device 20 may generate the internal clock signal INT_CLK having a frequency which is twice higher than that of the input clock signal ICLK according to a phase difference between the input clock signal ICLK and the first input control signal ICNT<1> when the first test mode signal TM_CLK is enabled to have a logic "high" level. That is, the internal clock generator 22 may generate the internal clock signal INT_CLK having two cycles for one cycle of the input clock signal ICLK, as indicated in a time period "X".

The internal strobe signal generator 23 of the second semiconductor device 20 may generate the internal strobe signal INT_DQS having a frequency which is twice higher than that of the input strobe signal IDQS according to a phase difference between the input strobe signal IDQS and the second input control signal ICNT<2> when the first test mode signal TM_CLK has a logic "high" level. That is, the internal strobe signal generator 23 may generate the internal strobe signal INT_DQS having two cycles for one cycle of the input strobe signal IDQS, as indicated in a time period "Y".

The internal data generator 24 of the second semiconductor device 20 may control the phases of the first to fourth input data DIN<1:4> synchronized with the input strobe signal IDQS in response to the second test mode signal TM_INV having a logic "high" level to generate the first to eighth internal data INT_DIN<1:8>. Further, the internal data generator 24 may store the first to eighth internal data INT_DIN<1:8> in the memory cell array portion 25. That is, the internal data generator 24 may receive the first to fourth input data DIN<1:4> having four bits to generate the first to eighth internal data INT_DIN<1:8> having eight bits and may store the first to eighth internal data INT_DIN<1:8> in the memory cell array portion 25.

As described above, an electronic system according to some embodiments may operate to internally generate an internal clock signal having a frequency which is twice higher than that of a clock signal and an internal strobe signal having a frequency which is twice higher than that of a strobe signal. Thus, even though the clock signal generated from an external device has a low frequency, the electronic system may operate at a high frequency to reduce a test time.

What is claimed is:

1. An electronic system comprising:
   a first semiconductor device configured to output a clock signal, a strobe signal, a first control signal having a predetermined phase difference from the clock signal and a second control signal having the predetermined phase difference from the strobe signal; and
   a second semiconductor device configured to generate an internal clock signal having a higher frequency than the clock signal according to a phase difference between the clock signal and the first control signal and to generate an internal strobe signal having a higher frequency than the strobe signal according to a phase difference between the strobe signal and the second control signal to receive and/or output data,
   wherein the first control signal has a phase difference of 270 degrees or 90 degrees from the clock signal.

2. The electronic system of claim 1, wherein the second control signal has a phase difference of 270 degrees from the strobe signal.

3. The electronic system of claim 1, wherein a frequency of the internal clock signal is twice higher than that of the clock signal.

4. The electronic system of claim 1, wherein a frequency of the internal strobe signal is twice higher than that of the strobe signal.

5. The electronic system of claim 1, wherein the strobe signal is synchronized with the clock signal.

6. The electronic system of claim 1, wherein the second semiconductor device includes:
   a signal input unit configured to buffer the clock signal, the strobe signal, the first control signal, the second control signal and the data to generate an input clock signal, an input strobe signal, a first input control signal, a second input control signal and input data;
   an internal clock generator configured to generate the internal clock signal according to a phase difference between the input clock signal and the first input control signal; and
   an internal strobe signal generator configured to generate the internal strobe signal according to a phase difference between the input strobe signal and the second input control signal.

7. The electronic system of claim 6, wherein the internal clock generator includes:
   a first control signal generator configured to buffer the first input control signal in response to a first test mode signal to generate a first internal control signal and a first complementary internal control signal;
   a pre-clock generator configured to invert or buffer the input clock signal according to logic levels of the first internal control signal and the first complementary internal control signal to generate a pre-clock signal; and
   a first driver configured to buffer the pre-clock signal in response to the first test mode signal to generate the internal clock signal.

8. The electronic system of claim 7, wherein the internal strobe signal generator includes:
   a second control signal generator configured to buffer the second input control signal in response to the first test mode signal to generate a second internal control signal and a second complementary internal control signal;
   a pre-strobe signal generator configured to invert or buffer the input strobe signal according to logic levels of the second internal control signal and the second complementary internal control signal to generate a pre-strobe signal; and
   a second driver configured to buffer the pre-strobe signal in response to the first test mode signal to generate the internal strobe signal.

9. The electronic system of claim 6, wherein the second semiconductor device further includes an internal data generator configured to control phases of the input data synchronized with the input strobe signal in response to a second test mode signal to generate internal data and configured to store the internal data in a memory cell array portion.

10. The electronic system of claim 9, wherein the number of bits of the internal data is twice the number of bits of the input data.

11. A semiconductor device comprising:
    an internal clock generator configured to generate an internal clock signal having a frequency which is higher than that of an input clock signal according to a phase difference between the input clock signal generated from an external device and a first input control signal; and
    an internal strobe signal generator configured to generate an internal strobe signal having a frequency which is higher than that of an input strobe signal according to a phase difference between the input strobe signal generated from the external device and a second input control signal,
    wherein the first input control signal has a phase difference of 270 degrees or 90 degrees from the input clock signal.

12. The semiconductor device of claim 11, wherein the second input control signal has a phase difference of 270 degrees from the input strobe signal.

13. The semiconductor device of claim 11, wherein the second input control signal has a phase difference of 90 degrees from the input strobe signal.

14. The semiconductor device of claim 11, wherein a frequency of the internal clock signal is twice higher than that of the input clock signal.

15. The semiconductor device of claim 11, wherein a frequency of the internal strobe signal is twice higher than that of the input strobe signal.

16. The semiconductor device of claim 11, wherein the internal clock generator includes:
    a first control signal generator configured to buffer the first input control signal in response to a first test mode signal to generate a first internal control signal and a first complementary internal control signal;
    a pre-clock generator configured to invert or buffer the input clock signal according to logic levels of the first internal control signal and the first complementary internal control signal to generate a pre-clock signal; and
    a first driver configured to buffer the pre-clock signal in response to the first test mode signal to generate the internal clock signal.

17. The semiconductor device of claim 16, wherein the internal strobe signal generator includes:
    a second control signal generator configured to buffer the second input control signal in response to the first test mode signal to generate a second internal control signal and a second complementary internal control signal;

a pre-strobe signal generator configured to invert or buffer the input strobe signal according to logic levels of the second internal control signal and the second complementary internal control signal to generate a pre-strobe signal; and a second driver configured to buffer the pre-strobe signal in response to the first test mode signal to generate the internal strobe signal.

18. The semiconductor device of claim 11, further comprising:

a signal input unit configured to buffer a clock signal, a strobe signal, a first control signal, a second control signal and data, which are generated from an external device, to generate the input clock signal, the input strobe signal, the first input control signal, the second input control signal and the input data; and an internal data generator configured to control phases of the input data synchronized with the input strobe signal in response to a second test mode signal to generate internal data and configured to store the internal data in a memory cell array portion.

19. The semiconductor device of claim 18, wherein the number of bits of the internal data is twice the number of bits of the input data.

* * * * *